(12) United States Patent
Pham

(10) Patent No.: US 7,436,208 B1
(45) Date of Patent: Oct. 14, 2008

(54) CARRY CIRCUIT WITH POWER-SAVE MODE

(75) Inventor: Tien Duc Pham, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 88 days.

(21) Appl. No.: 11/487,916

(22) Filed: Jul. 17, 2006

(51) Int. Cl.
*G06F 7/38* (2006.01)
*H03K 19/173* (2006.01)
*H03K 19/0175* (2006.01)

(52) U.S. Cl. .............................. 326/38; 326/37; 326/62

(58) Field of Classification Search ............. 326/37–50, 326/62–90, 38
See application file for complete search history.

(56) References Cited

U.S. PATENT DOCUMENTS 6,937,062 B1 *  8/2005  Hwang et al. .................. 326/38
7,268,584 B1 *  9/2007  Cashman et al. .............. 326/39

OTHER PUBLICATIONS

U.S. Appl. No. 11/151,796, filed Jun. 14, 2005, Young et al.
U.S. Appl. No. 11/152,012, filed Jun. 14, 2005, Pham et al.

* cited by examiner

*Primary Examiner*—Rexford Barnie
*Assistant Examiner*—Matthew C Tabler
(74) *Attorney, Agent, or Firm*—W. Eric Webostad

(57) ABSTRACT

A carry circuit having a power-save mode and a method for reducing power consumption of an integrated circuit are described. A power-save input is selected for control select signaling. A voltage level input is selected as an initial carry input. The initial carry input is propagated through a carry stage responsive to the carry input and the control select signaling. The carry stage is placed in a first non-switching steady state mode responsive to the propagating of the initial carry input through the carry stage.

18 Claims, 6 Drawing Sheets

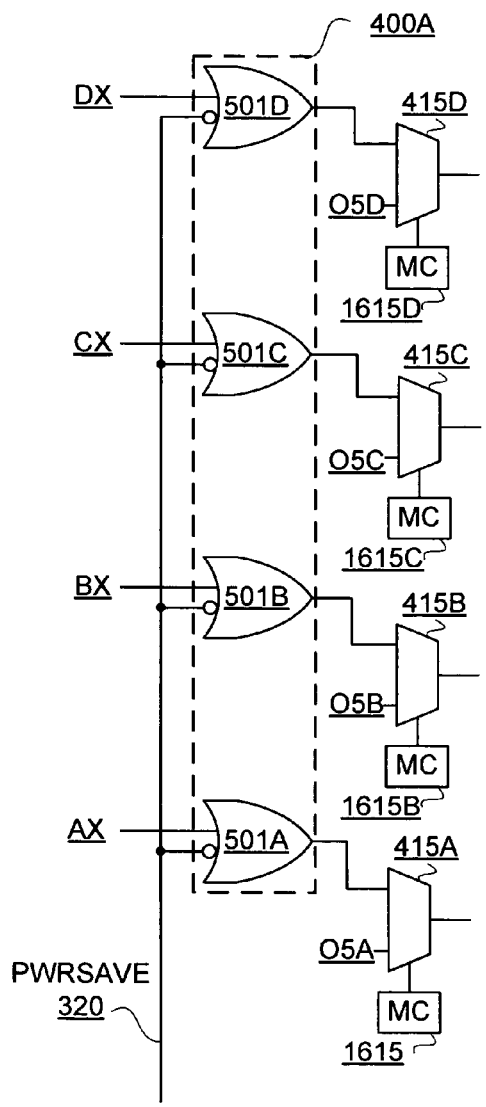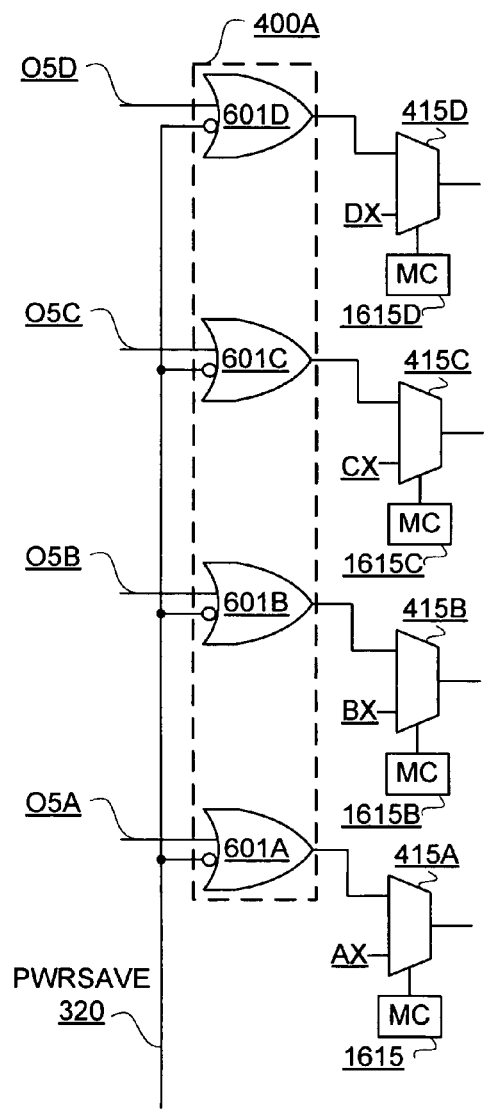
FIG. 5B
FIG. 6B

CARRY CIRCUIT WITH POWER-SAVE MODE

FIELD OF THE INVENTION

One or more aspects of the invention relate generally to integrated circuits and, more particularly, to a carry circuit having a power-save mode.

BACKGROUND OF THE INVENTION

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. Notably, as used herein, "include" and "including" mean including without limitation.

One such FPGA is the Xilinx Virtex® FPGA available from Xilinx, Inc., 2100 Logic Drive, San Jose, Calif. 95124. Another type of PLD is the Complex Programmable Logic Device ("CPLD"). A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. Other PLDs are programmed by applying a processing layer, such as a metal layer, that programmably interconnects the various elements on the device. These PLDs are known as mask programmable devices. PLDs can also be implemented in other ways, for example, using fuse or antifuse technology. The terms "PLD" and "programmable logic device" include but are not limited to these exemplary devices, as well as encompassing devices that are only partially programmable.

For purposes of clarity, FPGAs are described below though other types of PLDs may be used. FPGAs may include one or more embedded microprocessors. For example, a microprocessor may be located in an area reserved for it, generally referred to as a "processor block."

Heretofore, instantiating a design in programmable logic of an FPGA ("FPGA fabric") required each carry chain of each Configurable Logic Element ("CLE") of each Configurable Logic Block ("CLB") to remain in an operative mode. This was true even for those CLEs of an instantiated design not actively using such one or more carry chains. Accordingly, as such CLEs may continue to have circuits that switch, such carry chains may consume power needlessly.

Accordingly, it would be desirable and useful to provide means for reducing power consumption due to one or more unused carry chains.

SUMMARY OF THE INVENTION

One or more aspects of the invention generally relate to integrated circuits and, more particularly, to a carry circuit having a power-save mode.

An aspect of the invention is an integrated circuit with a carry chain including an initialization stage, a carry stage, and an output stage. Mode select circuitry is coupled to the carry chain and configurable to put the carry chain in a power-save mode. The mode select circuitry includes mode circuitry coupled to the initialization stage, the mode circuitry configurable for selecting of a voltage level input and for coupling the voltage level input as an initial carry input of the carry chain for the power-save mode. Select circuitry is coupled to the mode circuitry to receive a power-save input therefrom and coupled to the carry stage for providing control select signaling thereto. For the power-save input being for the power-save mode, the control select signaling is for causing propagation of the initial carry input through the carry stage to provide the initial carry input as interim carry outputs of the carry stage. The output stage is coupled to the carry stage for receiving the initial carry input and the interim carry outputs as first value inputs. The output stage is coupled to the select circuitry for receiving the control select signaling therefrom as second value inputs. The output stage is put in a first non-switching steady state mode responsive to processing the first value inputs and the second value inputs for the power-save mode. The carry stage is put in a second non-switching steady state mode responsive to propagation of the initialization input through the carry stage.

Another aspect of the invention is a method for reducing power consumption of an integrated circuit. A power-save input is selected for control select signaling. A voltage level input is selected as an initial carry input. The initial carry input is propagated through a carry stage responsive to the carry input and the control select signaling. The carry stage is placed in a first non-switching steady state mode responsive to the propagating of the initial carry input through the carry stage.

Yet another aspect of the invention is an integrated circuit including programmable logic having groups of lookup tables and having a carry chain for each group of the groups of lookup tables. The carry chain is coupled to receive outputs from the group of the lookup tables associated therewith. The carry chain includes an initialization stage, a carry stage, an output stage, and mode select circuitry. The mode select circuitry is configurable to put the carry chain in a power-save mode. The mode select circuitry includes mode circuitry coupled to the initialization stage, the mode circuitry configurable for selecting of a voltage level input and for coupling the voltage level input as an initial carry input of the carry chain for the power-save mode. Select circuitry is coupled to the mode circuitry to receive a power-save input therefrom, coupled to the lookup tables to receive a portion of the outputs therefrom, and coupled to the carry stage for providing control select signaling thereto responsive to respectively gating the portion of the outputs from the lookup tables with the power-save input.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

FIGS. 5A, 5B, 6A and 6B are circuit diagrams depicting respective alternative exemplary embodiments of OR gates that may be employed in the carry chain logic of FIGS. 3 and 4.

DETAILED DESCRIPTION OF THE DRAWINGS

In the following description, numerous specific details are set forth to provide a more thorough description of the specific embodiments of the invention. It should be apparent, however, to one skilled in the art, that the invention may be practiced without all the specific details given below. In other instances, well known features have not been described in detail so as not to obscure the invention. For ease of illustration, the same number labels are used in different diagrams to refer to the same items; however, in alternative embodiments the items may be different.

Figure 1:
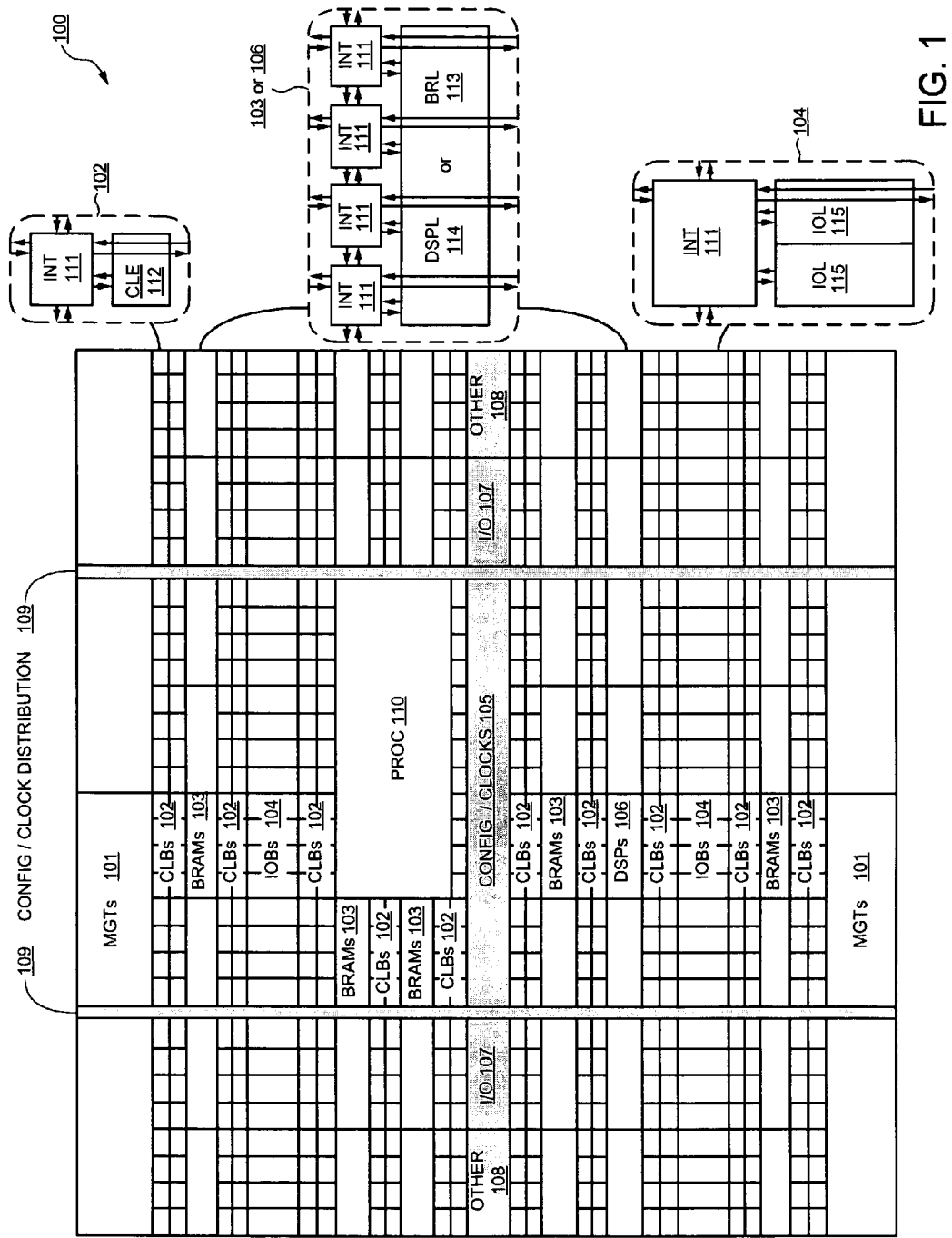
FIG. 1 is a simplified block diagram depicting an exemplary embodiment of a columnar Field Programmable Gate Array ("FPGA") architecture in which one or more aspects of the invention may be implemented.

FIG. 1 illustrates an FPGA architecture 100 that includes a large number of different programmable tiles including multi-gigabit transceivers ("MGTs") 101, configurable logic blocks ("CLBs") 102, random access memory blocks ("BRAMs") 103, input/output blocks ("IOBs") 104, configuration and clocking logic ("CONFIG/CLOCKS") 105, digital signal processing blocks ("DSPs") 106, specialized input/output ports ("I/O") 107 (e.g., configuration ports and clock ports), and other programmable logic 108 such as digital clock managers, analog-to-digital converters, system monitoring logic, and so forth. Some FPGAs also include dedicated processor blocks ("PROC") 110.

In some FPGAs, each programmable tile includes a programmable interconnect element ("INT") 111 having standardized connections to and from a corresponding interconnect element 111 in each adjacent tile. Therefore, the programmable interconnect elements 111 taken together implement the programmable interconnect structure for the illustrated FPGA. Each programmable interconnect element 111 also includes the connections to and from any other programmable logic element(s) within the same tile, as shown by the examples included at the right side of FIG. 1.

For example, a CLB 102 can include a configurable logic element ("CLE") 112 that can be programmed to implement user logic plus a single programmable interconnect element 111. A BRAM 103 can include a BRAM logic element ("BRL") 113 in addition to one or more programmable interconnect elements 111. Typically, the number of interconnect elements included in a tile depends on the height of the tile. In the pictured embodiment, a BRAM tile has the same height as four CLBs, but other numbers (e.g., five) can also be used. A DSP tile 106 can include a DSP logic element ("DSPL") 114 in addition to an appropriate number of programmable interconnect elements 111. An IOB 104 can include, for example, two instances of an input/output logic element ("IOL") 115 in addition to one instance of the programmable interconnect element 111. As will be clear to those of skill in the art, the actual I/O pads connected, for example, to the I/O logic element 115 are manufactured using metal layered above the various illustrated logic blocks, and typically are not confined to the area of the I/O logic element 115.

In the pictured embodiment, a columnar area near the center of the die (shown shaded in FIG. 1) is used for configuration, I/O, clock, and other control logic. Vertical areas 109 extending from this column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, the processor block 110 shown in FIG. 1 spans several columns of CLBs and BRAMs.

Note that FIG. 1 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the right side of FIG. 1 are purely exemplary. For example, in an actual FPGA more than one adjacent column of CLBs is typically included wherever the CLBs appear, to facilitate the efficient implementation of user logic. FPGA 100 illustratively represents a columnar architecture, though FPGAs of other architectures, such as ring architectures for example, may be used. FPGA 100 may be a Virtex-4™ FPGA from Xilinx of San Jose, Calif.

A CLB includes a Configurable Logic Element ("CLE") as well as routing circuitry. Within a CLE, there may be one or more slices. Generally, a slice includes look-up tables ("LUTs"), a carry chain, multiplexers, and flip-flops. Additional details regarding slices may be found in co-pending and related patent applications entitled, "Programmable Logic Block with Carry Chains Providing Lookahead Functions of Different Lengths" by Pham et al., filed Jun. 14, 2005, U.S. patent application Ser. No. 11/152,012 and "Programmable Logic Block Providing Carry Chain with Programmable Initialization Values" by Young et al., filed Jun. 14, 2005, U.S. patent application Ser. No. 11/151,796, each of which is incorporated by reference herein in its entirety.

In short, outputs from LUTs of a slice drive a carry chain of a slice. Therefore, whenever outputs of one or more LUTs switch, associated carry chain circuitry switches as well. However, a user may implement a design that uses, for example, LUTs and flip-flops of a slice without using the carry chain. Therefore, by effectively providing a power-save mode, the carry chain may be put in a state which is independent of LUT output signaling coupled thereto. As shall become more apparent from the following description, this power-save mode can be turned on or off programmably by user programming.

Figure 2:
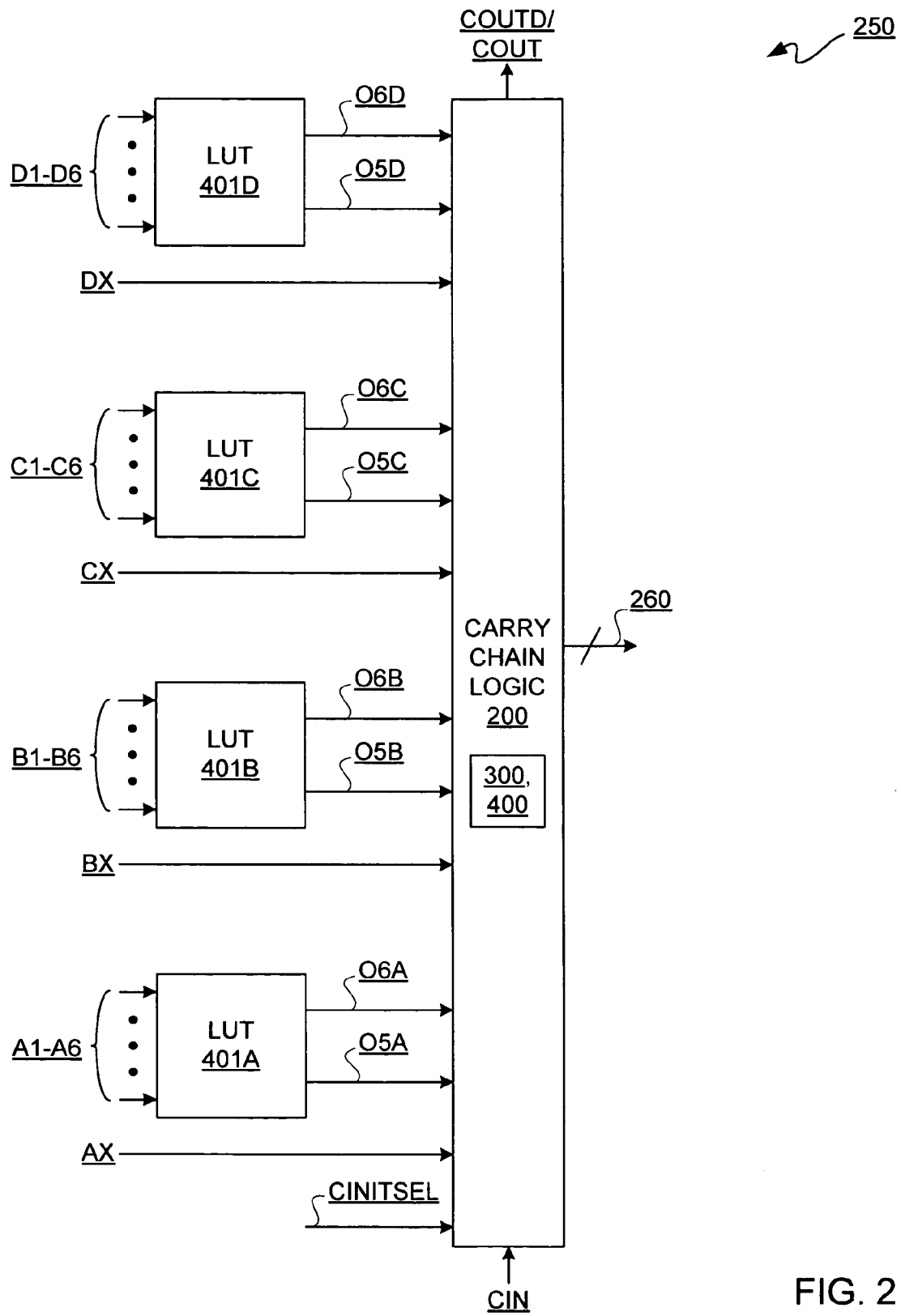
FIG. 2 is a block diagram depicting an exemplary embodiment of a portion of a slice of a Configurable Logic Element ("CLE") of a Configurable Logic Block ("CLB") of an integrated circuit, such as the FPGA of FIG. 1.

FIG. 2 is a block diagram depicting an exemplary embodiment of a portion of a slice 250. Notably, a multiplexing output stage and a flip-flop output stage of slice 250 are not shown here for purposes of clarity.

Slice 250 includes LUTs 401A through 401D. Each LUT 401A through 401D receives a respective set of inputs, namely inputs A1 through A6, B1 through B6, C1 through C6, and D1 through D6. Each LUT 401A through 401D provides two outputs, namely outputs O5A and O6A from LUT 401A, outputs O5B and O6B from LUT 401B, outputs O5C and O6C from LUT 401C, and outputs O5D and O6D from LUT 401D. Outputs O5A through O5D and O6A through O6D are provided to carry chain logic 200. Additionally provided to carry chain logic 200 are carry bypass inputs AX through DX.

Carry chain logic 200 may receive a carry initialization select signal ("CINITSEL"). Such a carry initialization select signal may be used to determine where in carry chain logic 200 such carry chain is to be initialized. Notably, as described in additional detail below, such a carry initialization select signal may be overridden. Furthermore, a cascade or carry in signal ("CIN"), which may come from another slice, may be used to cascade slices for providing a carry input to a downstream slice. Output from carry chain logic 200 are sums 260 and carry output signal ("COUT").

Figure 3:
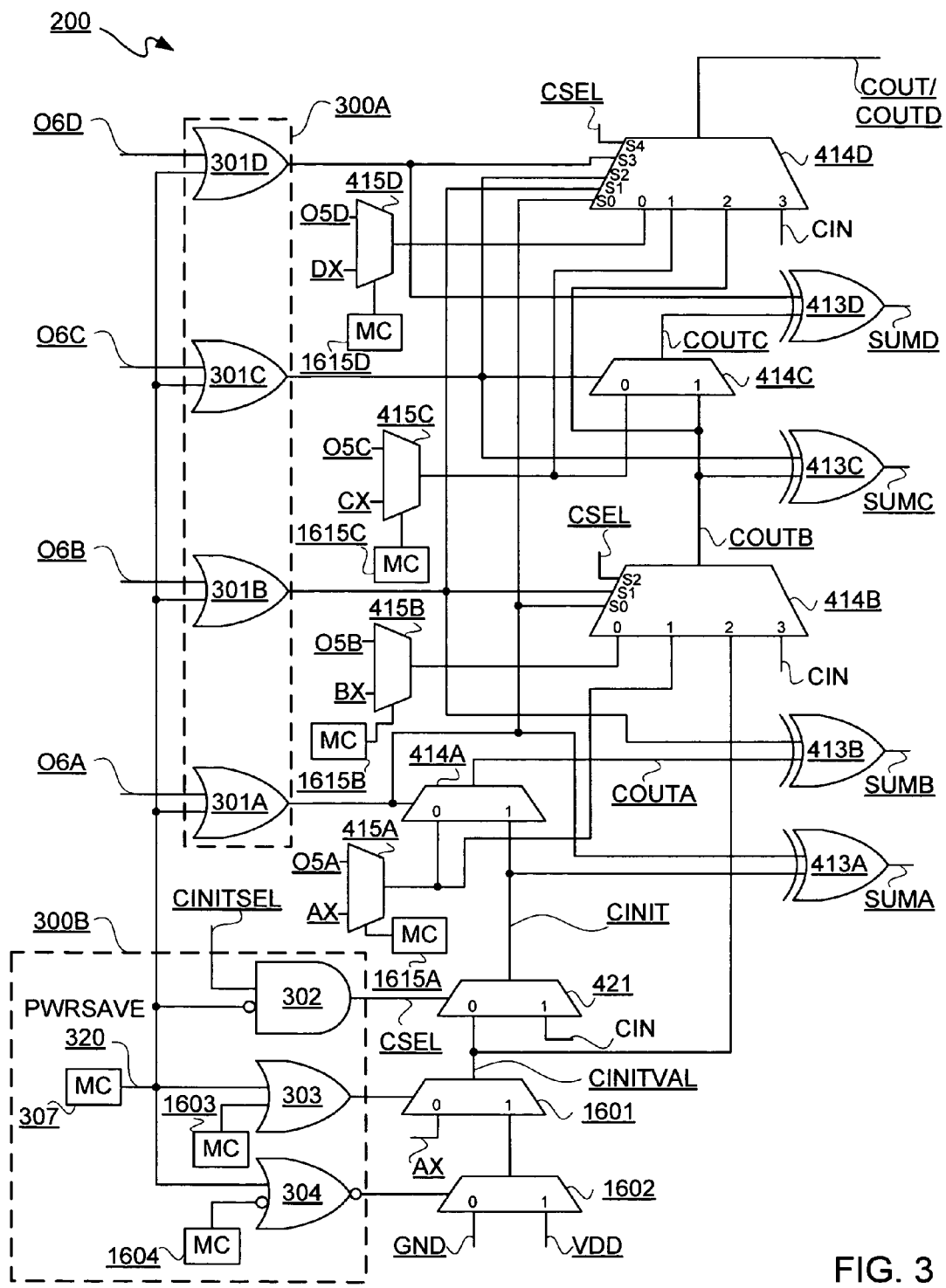
FIG. 3 is a circuit diagram depicting an exemplary embodiment of carry chain logic of the slice of FIG. 2 with power-save mode circuitry.
Figure 4:
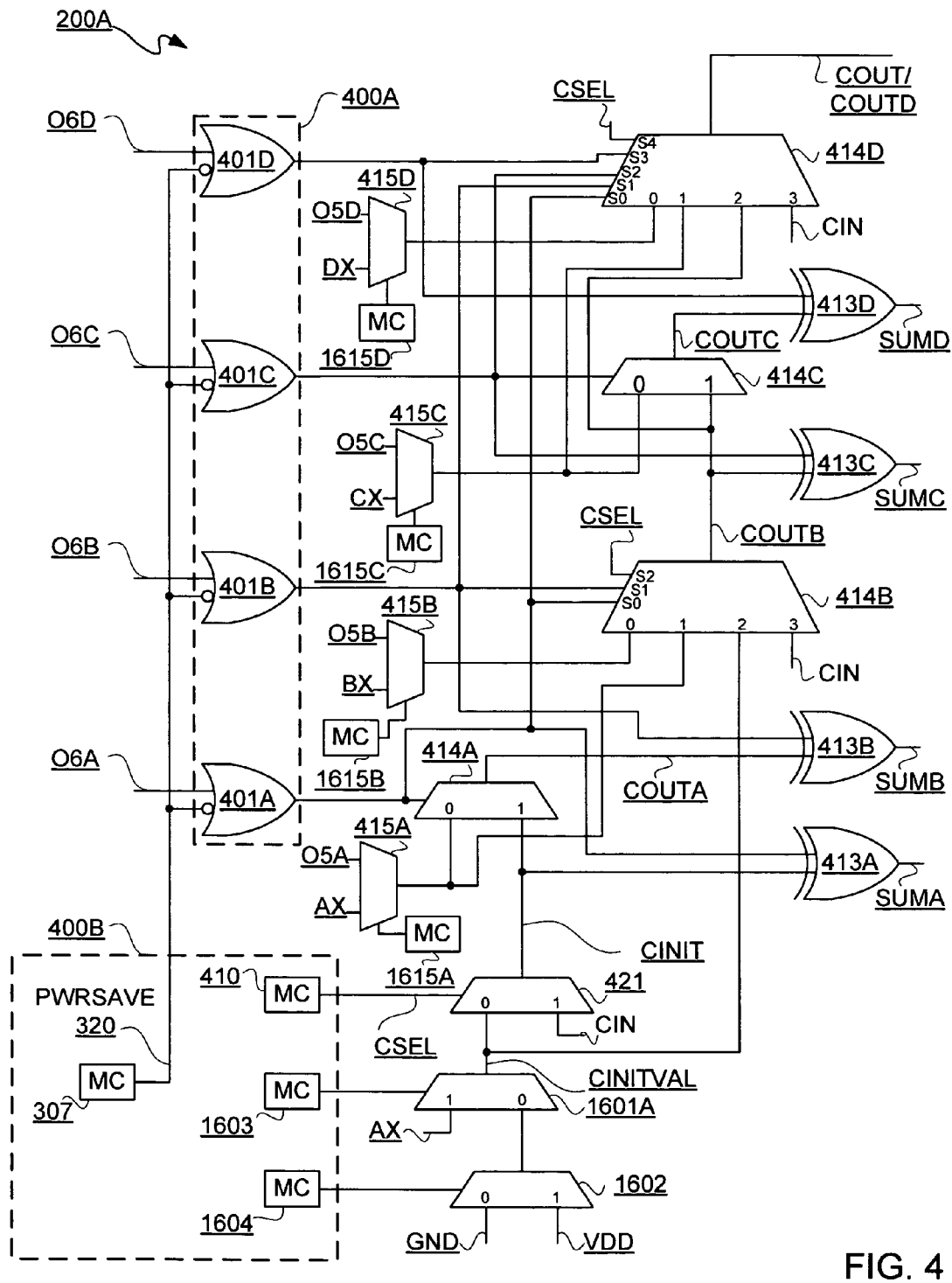
FIG. 4 is a circuit diagram depicting an alternative exemplary embodiment of the carry chain logic of FIG. 3.

A multiplexer of carry chain logic 200, such as multiplexer 414D as illustratively shown in FIGS. 3 and 4, may be designed to minimize the delay from carry in signal CIN to carry out signal COUT for an entire slice. Multiplexer 414D may be configured to be controlled by CIN and by control select signals of multiplexer 414D. When carry in signal CIN is selected, multiplexer 414D may essentially provide carry in signal CIN as carry out signal COUT or "COUTD." When one of the input signals to multiplexer 414D other than the carry in signal CIN is selected, multiplexer 414D may be configured to provide carry out signal COUTD.

Notably, carry chain logic 200 includes power-save mode circuitry 300, which is described in additional detail with reference to FIG. 3. Alternatively, carry chain logic 200 may include power-save mode circuitry 400, which is described in additional detail with reference to FIG. 4.

Referring to FIG. 3, there is shown a circuit diagram depicting an exemplary embodiment of carry chain logic 200 with power-save mode circuitry 300. Power-save mode circuitry 300 is broken into two blocks 300A and 300B. Block 300A is select circuitry, and block 300B is mode circuitry. Notably, both blocks 300A and 300B may be implemented using a single logic level of gates. Select circuitry 300A includes OR gates 301A through 301D. Power-save input signal ("PWRSAVE") 320 and outputs O6A through O6D from LUTs 401A through 401D of slice 250 of FIG. 2 are provided as inputs to OR gates 301A through 301D, respectively. Thus, block 300A selects whether to provide a power-save input signal 320 or outputs O6A through O6D to carry multiplexers 414A through 414D and exclusive-OR ("XOR") gates of carry chain logic 200.

Mode circuitry 300B may be considered to include memory cells 307, 1603, and 1604, as well as AND gate 302, OR gates 303 and 304, and associated inverters. Memory cell 307 provides power-save input signal 320 to all gates of select circuitry 300A and mode circuitry 300B; more particularly, power-save input signal 320 is provided as an input to OR gates 301A through 301D, OR gate 303, and NOR gate 304 and as an inverted input to AND gate 302. If memory cell 307 is programmed to provide a logic 0, then normal operation of carry chain logic 200 may proceed. In a power-save mode, memory cell 307 is programmed to output a logic 1.

In addition to power-save input signal 320, OR gate 303 receives an input from memory cell 1603. When a logic 1 is output from memory cell 307 as power-save input signal 320, output of OR gate 303 is a logic 1 independent of the programming state of memory cell 1603. Output of memory cell 307, namely power-save input signal 320, is further provided as an inverted input to AND gate 302 and as an input to NOR gate 304. Output of memory cell 1604 is provided as an inverted input to NOR gate 304. Another input to AND gate 302 is CINITSEL.

In a power-save mode, when a logic 1 is output from memory cell 307 to the inverted input of AND gate 302, output of AND gate 302 is a logic 0 independent of the state of CINITSEL. Furthermore, when a logic 1 is output from memory cell 307, NOR gate 304 will provide a logic 0 output independent of the state of memory cell 1604. Thus, it should be appreciated that in a power-save mode, states of memory cells 1603 and 1604, as well as state of CINITSEL, may be overridden. Notably, CINITSEL and memory cells 1603 and 1604 may be used for normal operation when memory cell 307 is in a logic 0 state.

When a logic 0 output form NOR gate 304 in power-save mode, a ground ("GND") input is selected for output from multiplexer 1602. Notably, this ground may be an actual ground or a virtual ground. Output from multiplexer 1602 is provided as an input to multiplexer 1601. When a logic 1 is output from OR gate 303, namely in a power-save mode, output from multiplexer 1601 is the input obtained from multiplexer 1602. Output from multiplexer 1601, which is a logic 0 in a power-save mode, is provided as an input to multiplexer 421. For output of AND gate 302 being a logic 0, again namely in a power-save mode, output from multiplexer 421 is the input obtained from output of multiplexer 1601. Notably, the output of multiplexer 1601 may be thought of as a carry initialization value ("CINITVAL"). The other input to multiplexer 421 may be a cascade or carry in signal ("CIN"), as previously described. Thus, the output of multiplexer 412 is another carry initialization value ("CINIT") used for a carry stage of carry chain logic 200. It should be appreciated that when memory cell 307 is in a logic 1 state, CINIT is coupled to ground via the chain of multiplexers 1602, 1601, and 421, and so for a power-save mode, CINIT is a logic 0. Alternatively, the chain of multiplexers 1602, 1601, and 421 for an initialization stage of carry chain logic 200 may be controlled to provide a logic 1 for a power-save mode. However, for purposes of clarity by way of example and not limitation, it shall be assumed that CINIT is a logic 0.

CINIT is provided as an input to exclusive OR ("XOR") gate 413A; accordingly, in a power-save mode, when CINIT is a logic 0, one of the inputs to XOR gate 413A is a logic 0. When power-save input signal 320 is a logic 1 provided to OR gates 301A through 301D of select circuitry 300A, the output from each of those OR gates will be a logic 1.

Output of OR gate 301A is provided as a control select signal to multiplexer 414A. When a logic 1 control select signal is input to multiplexer 414A, CINIT is selected for logic output therefrom. Accordingly, output of multiplexer 414A is a logic 0 which is provided as an input to XOR gate 413B. The other input to XOR gates 413A and 413B are the logic 1s respectively output from OR gates 301A and 301B. The outputs of XOR gates 413A and 413B are each thus a steady state of logic 1 for a power-save mode.

Notably, output of AND gate 302, namely carry initialization select signal ("CSEL"), is a logic 0 in a power-save mode. Carry initialization select signal CSEL is provided as a select signal to multiplexer 421, to the S2 port of multiplexer 414B, and to the S4 port of multiplexer 414D. Accordingly, the S2 input to multiplexer 414B and the S4 input to multiplexer 414D are both logic 0s in a power-save mode. The S0 and S1 inputs to multiplexer 414B are both logic 1s as respectively obtained from the outputs of OR gates 301A and 301B. Accordingly, multiplexer 414B will select input 2 as carry out B signal ("COUTB"). Notably, in a power-save mode, the 0, 1, and 3 inputs to multiplexer 414B are not used. Input 2 to multiplexer 414B is carry initialization value signal CINITVAL, which in a power-save mode is a logic 0 output from multiplexer 1601. Carry out B signal COUTB is provided as a logic 0 input to multiplexer 414C and to XOR gate 413C. Another input to XOR gate 413C is the output of OR gate 301C, which in a power-save mode is a logic 1. Accordingly, the output of XOR gate 413C is a logic 1.

The output of OR gate 301C is provided as a control select signal to multiplexer 414C. When the output of OR gate 301C is a logic 1, the input to the logic 1 input port of multiplexer 414C, which is the COUTB signal, is selected for output. In a power-save mode, COUTB is a logic 0, and accordingly a logic 0 will be output as a carry out C signal ("COUTC") and provided as an input to XOR gate 413D. Another input to XOR gate 413D is the output of OR gate 301, which in a power-save mode is a logic 1. Accordingly, the output of XOR gate 413D is a logic 1.

The S0, S1, S2, and S3 control select inputs of multiplexer 414D are respectively provided from the outputs of OR gates 301A through 301D. As each of these outputs from OR gates 301A through 301D is a logic 1 in a power-save mode, and CSEL provided as an S4 control select input to multiplexer 414D is a logic 0, input 2 of multiplexer 414D is selected for output as carry output signal COUT/COUTD. Input 2 of 414D is COUTB signal, which in a power-save mode is a logic 0. Accordingly, output COUT of multiplexer 414D in a power-save mode is a logic 0.

As is known, less power is consumed by transistors in a non-switching steady saturation state than is consumed when switching between saturation states. It should be appreciated that OR gates 301A through 301D are in a non-switching steady state after they continually provide a logic 1 output responsive to power-save input signal 320 being a logic 1. Furthermore, gates 302 through 304 are in a non-switching steady state after they have responded to power-save input signal 320 being a logic 1. Additionally, it should be appreciated that multiplexers 1601, 1602, and 421 are in a non-switching steady state after they have responded to the respective outputs of gates 304, 303, and 302. Multiplexers 414A, 414B, 414C, and 414D are also put in a non-switching steady state after they have responded to the various select inputs for passing the logic 0 from multiplexer 1602 up through multiplexer 414D. Thus, it should be appreciated that the respective outputs of multiplexers 1602, 1601, 421, and 414A through 414D are each coupled to ground through this carry logic chain of multiplexers. Additionally, it should be appreciated that XOR gates 413A through 413D are put in a non-switching steady state after they have responded to the combination of the propagation of the logic 0 provided as CINITVAL and CINIT, and the logic 1s output from select circuitry 300A. Thus, by putting a substantial portion of the circuitry of carry chain logic 200 in a non-switching steady state mode, less power may be consumed. As is known, more power is consumed when devices switch than when they are in a non-switching steady state.

Accordingly, it should be appreciated that an initialization stage, formed of multiplexers 1602, 1601, and 421, may be put in a non-switching steady state. A carry stage, formed of multiplexers 414A, 414B, 414C, and 414D, may be put in a non-switching steady state. An output stage formed of XOR gates 413A, 413B, 413C, and 413D may be put in a non-switching steady state. Furthermore, select circuitry 300A and mode circuitry 300B may both be put in a non-switching steady state. Accordingly, power consumption may be reduced in a power-save mode, as compared with allowing carry chain logic 200 to be in a switching state.

Carry chain logic 200 may include multiplexers 415A through 415D for respectively receiving bypass signals AX through DX and outputs O5A through O5D. Notably, it has not been previously addressed with respect to whether or not multiplexers 415A through 415D are put in a steady state. However, in a power-save mode, memory cells 1615A through 1615D may be programmed to select inputs AX through DX for output respectively from multiplexers 415A through 415D. Furthermore, signals AX through DX may be gated with power-save input 320 respectively using OR gates 501A through 501D, as illustratively shown in the respective circuit diagrams of FIGS. 5A and 5B. OR gates 501A through 501D may be added to select circuitry 300A or 400A respectively of FIGS. 3 and 4.

Figure 5A:
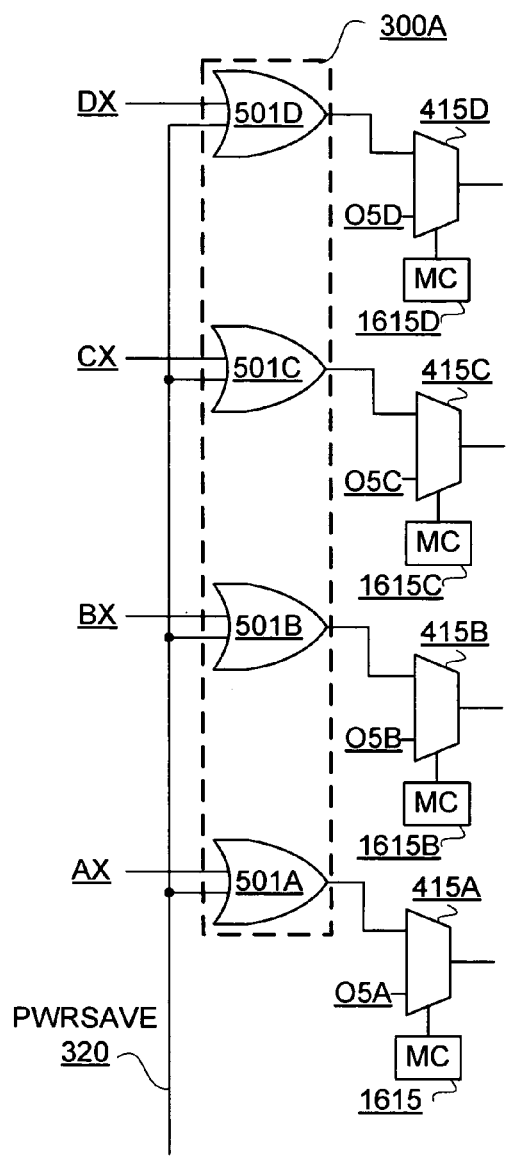

In FIG. 5A, OR gates 501A through 501D are coupled to respectively receive AX through DX signals as an input that is OR'd with power-save input signal 320 for addition to select circuitry 300A. In FIG. 5B, OR gates 501A through 501D are coupled to respectively receive AX through DX signals as an input that is OR'd with an inverted version of power-save input signal 320 for addition to select circuitry 400A.

Outputs of OR gates 501A through 501D are respectively provided as inputs to multiplexers 415A through 415D. Thus, select circuitry 300A or 400A may select whether to provide a power-save input signal 320 or inverted version thereof, respectively, or to provide bypass signals AX through DX to carry chain logic. Accordingly for like reasoning as previously described, for a power-save mode when power-save input signal 320 is active, multiplexers 415A through 415D may be put in a non-switching steady state for purposes of a power-save mode.

Figure 6A:
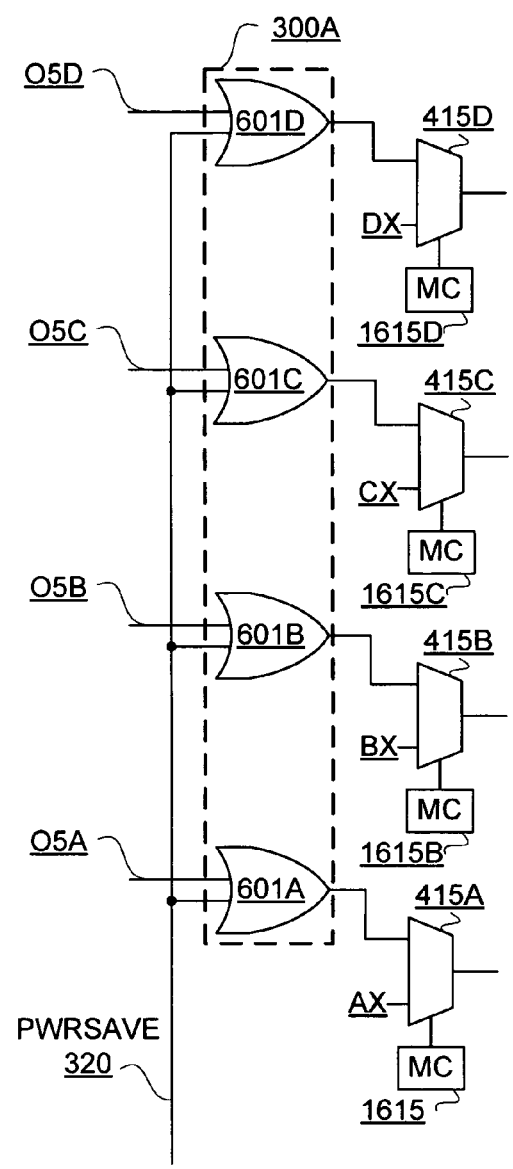

Alternatively, as illustratively shown in FIGS. 6A and 6B, in a power-save mode, memory cells 1615A through 1615D may be programmed to select inputs O5A through O5D for output respectively from multiplexers 415A through 415D. OR gates 601A through 601D may be coupled to respectively receive O5A through O5D signals. Signals O5A through O5D may be gated with power-save input 320 respectively using OR gates 601A through 601D, as illustratively shown in the circuit diagram of FIG. 6A for addition to select circuitry 300A of FIG. 3. Signals O5A through O5D may be gated with an inverted version of power-save input 320 respectively using OR gates 601A through 601D, as illustratively shown in the circuit diagram of FIG. 6B for addition to select circuitry 400A of FIG. 4.

Accordingly, OR gates 601A through 601D of FIGS. 6A and 6B may be added to select circuitry 300A and 400A, respectively. Outputs of OR gates 601A through 601D are respectively provided as inputs to multiplexers 415A through 415D. Thus, select circuitry 300A or 400A may select whether to provide a power-save input signal 320 or an inverted version thereof, respectively, or to provide outputs O5A through O5D to carry chain logic. Accordingly for like reasoning as previously described, for a power-save mode when power-save input signal 320 is active, multiplexers 415A through 415D may be put in a non-switching steady state for purposes of a power-save mode.

Notably, it may be desirable to have the power-save mode be a default state for all carry chains in slices of programmable logic. Thus, it may be desirable to have each memory cell be programmed to the same state for such a default state.

FIG. 4 is a circuit diagram depicting an alternative exemplary embodiment of carry chain logic 200 of FIG. 2, namely carry chain logic 200A. As much of the circuitry of carry chain logic 200A of FIG. 4 is that same as that of carry chain logic 200 as illustratively shown in FIG. 3, only the differences are described below for purposes of clarity.

Carry chain logic 200A of FIG. 4 includes select circuitry 400A and mode circuitry 400B. Mode circuitry 400B includes memory cells 410, 1603, 1604, and 307. Notably, there are not gates in mode circuitry 400B in contrast to mode circuitry 300B of FIG. 3. Notably, in this embodiment, the power-save input signal 320 is a logic 0, and not a logic 1, for a power-save mode. Power-save input signal 320 is provided as an inverted input to OR gates 401A through 401D. Thus, outputs of OR gates 401A through 401D) will all be logic 1s for output of memory cell 307 being in a logic 0 state. Furthermore, each of memory cells 410, 1603, and 1604 may be programmed in a logic 0 state for a power-save mode.

Notably, multiplexer 1601A of FIG. 4 is slightly different from multiplexer 1601 of FIG. 3. Multiplexer 1601A is configured such that a logic 0 control select signal, in a power-save mode in this embodiment, is used to select the output from multiplexer 1602 as the output for multiplexer 1601A. Thus, in a power-save mode in this embodiment, memory cells 410, 1603, and 1604 provide logic 0 control select signals respectively to multiplexers 421, 1601A, and 1602 for coupling an input of multiplexer 414A and XOR gate 413A to ground.

The remainder of operation of carry chain logic 200 of FIG. 4 is the same as previously described with reference to FIG. 3, and thus is not repeated. Furthermore, it should be appreciated that each of memory cells 1615A through 1615D may be programmed to a logic 0 for a power-save mode as a default state, and such logic 0 may be used to respectively select inputs AX through DX for each of multiplexers 415A through 415D for output therefrom. Such inputs AX through DX may be tied to a logic level voltage.

Thus, for a default state, it should be appreciated that all memory cells associated with carry chain logic 200A may be set to a same state, such as logic 0. This facilitates putting all carry chains in programmable logic initially in a same default state, namely a power-save mode. A user may override such default state on a CLE-by-CLE basis for each carry chain thereof to be used for implementing a design using programmable logic.

While the foregoing describes exemplary embodiment(s) in accordance with one or more aspects of the invention, other and further embodiment(s) in accordance with the one or more aspects of the invention may be devised without departing from the scope thereof, which is determined by the claim(s) that follow and equivalents thereof. Claim(s) listing steps do not imply any order of the steps. Trademarks are the property of their respective owners.

What is claimed is:

1. An integrated circuit, comprising:
   a carry chain including an initialization stage, a carry stage, and an output stage;
   the carry chain being part of a Configurable Logic Element of a programmable logic device;
   mode select circuitry coupled to the carry chain and configurable to put the carry chain in a power-save mode;
   the mode select circuitry including:
      mode circuitry coupled to the initialization stage, the mode circuitry configurable for selecting of a voltage level input and for coupling the voltage level input as an initial carry input of the carry chain for the power-save mode; and
      select circuitry coupled to the mode circuitry to receive a power-save input therefrom and coupled to the carry stage for providing control select signaling thereto;
      for the power-save input being for the power-save mode, the control select signaling for causing propagation of the initial carry input through the carry stage to provide the initial carry input as interim carry outputs of the carry stage;
      the output stage coupled to the carry stage for receiving the initial carry input and the interim carry outputs as first value inputs; and
      the output stage coupled to the select circuitry for receiving the control select signaling therefrom as second value inputs;
      wherein the output stage is put in a first non-switching steady state mode responsive to processing the first value inputs and the second value inputs for the power-save mode;
      wherein the carry stage is put in a second non-switching steady state mode responsive to propagation of the initialization input through the carry stage; and
      wherein the initialization stage in combination with the carry stage forms a series of multiplexers wherein, in the power-save mode, each multiplexer in the series of multiplexers receives the logic low voltage level as an input and provides the logic low voltage level as an output; and wherein the logic low voltage level is a ground voltage level.

2. The integrated circuit according to claim 1, wherein the voltage level input is a logic low voltage level.

3. The integrated circuit according to claim 2, wherein the initialization stage is put in the second non-switching steady state mode responsive to the mode circuitry being in the power-save mode.

4. The integrated circuit according to claim 1, wherein the initialization stage is coupled to receive a cascade input as the initial carry input, the cascade input being from another Configurable Logic Element of the programmable logic device.

5. The integrated circuit according to claim 1, wherein the mode circuitry includes storage devices for putting the carry chain in either the power-save mode or an operational mode.

6. The integrated circuit according to claim 5, wherein the storage devices have associated therewith a default state, the default state being for the power-save mode.

7. The integrated circuit according to claim 5, wherein the select circuitry includes a single logic level of OR gates; wherein a first portion the single logic level of OR gates is coupled to receive a first set of output signals; wherein a second portion of the single logic level of OR gates is coupled to receive either a second set of output signals or a set of bypass signals; and wherein each of the OR gates is coupled to receive the power-save input.

8. The integrated circuit according to claim 5, wherein the first non-switching steady state mode is a steady state of logic high voltage level; and wherein the second non-switching steady state mode is a steady state of a logic low voltage level, the voltage level input being the logic low voltage level.

9. A method for reducing power consumption of an integrated circuit, comprising:
   selecting a power-save input for control select signaling;
   selecting a voltage level input as an initial carry input;
   propagating the initial carry input through a carry stage responsive to the carry input and the control select signaling;
   the carry stage being part of carry chain of a Configurable Logic Element of a programmable logic device, the carry chain comprising a series of multiplexers; and
   placing the carry stage in a first non-switching steady state mode responsive to the propagating of the initial carry input through the carry stage, wherein, in the power-save mode, each multiplexer in the series of multiplexers receives the logic low voltage level as an input and provides the logic low voltage level as an output; and wherein the logic low voltage level is a ground voltage level.

10. The method according to claim 9, further comprising:
    generating interim carry outputs responsive to the propagating;
    gating the control select signaling in combination with the initial carry input and interim carry outputs at an output stage; and
    placing the output stage in a second non-switching steady state mode responsive to the gating.

11. The method according to claim 10, further comprising programming memory for the selecting of the power-save input and the voltage level input.

12. The method according to claim 11, wherein the voltage level input is a ground.

13. The method according to claim 10, wherein the first non-switching steady state mode is a constant logic low level voltage; and wherein the second non-switching steady state mode is a constant logic high level voltage.

14. An integrated circuit, comprising:
   programmable logic having groups of lookup tables and having a carry chain for each group of the groups of lookup tables;
   the carry chain coupled to receive outputs from the group of the lookup tables associated therewith;
   the carry chain including an initialization stage, a carry stage, an output stage, and mode select circuitry;
   the carry chain being part of a Configurable Logic Element of a programmable logic device;
   the mode select circuitry configurable to put the carry chain in a power-save mode;
   the mode select circuitry including:
      mode circuitry coupled to the initialization stage, the mode circuitry configurable for selecting of a voltage level input and for coupling the voltage level input as an initial carry input of the carry chain for the power-save mode; and
      select circuitry coupled to the mode circuitry to receive a power-save input therefrom, coupled to the lookup tables to receive a portion of the outputs therefrom, and coupled to the carry stage for providing control select signaling thereto responsive to respectively gating the portion of the outputs from the lookup tables with the power-save input,
   wherein the initialization stage in combination with the carry stage forms a series of multiplexers wherein, in the power-save mode each multiplexer in the series of multiplexers receives the logic low voltage level as an input and provides the logic low voltage level as an output and wherein the logic low voltage level is a ground.

15. The integrated circuit according to claim 14, wherein for the power-save input being for the power-save mode, the control select signaling causes propagation of the initial carry input through the carry stage to provide the initial carry input as interim carry outputs of the carry stage.

16. The integrated circuit according to claim 15, wherein the output stage is coupled to the carry stage for receiving the initial carry input and the interim carry outputs as first value inputs; and wherein the output stage is coupled to the select circuitry for receiving the control select signaling therefrom as second value inputs.

17. The integrated circuit according to claim 16, wherein the output stage is put in a first non-switching steady state mode responsive to processing the first value inputs and the second value inputs for the power-save mode.

18. The integrated circuit according to claim 17, wherein the carry stage is put in a second non-switching steady state mode responsive to propagation of the initial carry input through the carry stage.

* * * * *